United States Patent
Sahu et al.

(10) Patent No.: US 11,424,756 B2
(45) Date of Patent: Aug. 23, 2022

(54) SUCCESSIVE APPROXIMATION REGISTER ANALOG-TO-DIGITAL CONVERTER WITH EMBEDDED FILTERING

(71) Applicant: TEXAS INSTRUMENTS INCORPORATED, Dallas, TX (US)

(72) Inventors: Debapriya Sahu, Bengaluru (IN); Pranav Sinha, Bengaluru (IN); Meghna Agrawal, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/007,887

(22) Filed: Aug. 31, 2020

(65) Prior Publication Data
US 2022/0069834 A1 Mar. 3, 2022

(51) Int. Cl.
H03M 1/12 (2006.01)
H03M 1/46 (2006.01)
H03M 1/18 (2006.01)
H03M 1/06 (2006.01)

(52) U.S. Cl.
CPC ......... *H03M 1/462* (2013.01); *H03M 1/0626* (2013.01); *H03M 1/182* (2013.01); *H03M 1/468* (2013.01)

(58) Field of Classification Search
CPC ...... H03M 1/468; H03M 1/462; H03M 1/466; H03M 1/1245; H03M 1/804; H03M 1/38; H03M 1/46; H03M 1/403; H03M 1/0863; H03M 1/1009; H03M 1/12
USPC .................................. 341/118–120, 155, 172
See application file for complete search history.

(56) References Cited

U.S. PATENT DOCUMENTS

| 5,006,853 A * | 4/1991 | Kiriaki | H03M 1/14 341/172 |
| 6,486,807 B2 * | 11/2002 | Jonsson | H03M 1/1057 341/120 |
| 7,187,319 B1 * | 3/2007 | Chowdhury | H03M 1/1245 341/161 |
| 8,502,723 B2 * | 8/2013 | Chen | H03M 1/1061 341/120 |
| 9,100,034 B2 * | 8/2015 | Oshima | H03M 1/002 |
| 2010/0079319 A1 * | 4/2010 | Berens | H03M 1/1038 341/120 |
| 2015/0180496 A1 * | 6/2015 | Drago | H03M 1/46 341/122 |
| 2016/0254821 A1 * | 9/2016 | Luo | H03K 5/2481 341/161 |
| 2016/0329867 A1 * | 11/2016 | Lesso | H03F 1/3258 |
| 2019/0166325 A1 * | 5/2019 | Kim | H04N 5/37452 |

(Continued)

OTHER PUBLICATIONS

David T. Lin "Flexible Digital-Intensive Wireless Receivers in Nanometer CMOS" public 2012. (Year: 2012).*

*Primary Examiner* — Linh V Nguyen
(74) *Attorney, Agent, or Firm* — Brian D Graham; Charles A. Brill; Frank D. Cimino

(57) ABSTRACT

A successive approximation register (SAR) analog-to-digital converter includes a capacitive digital-to-analog converter (CDAC), a comparator, and a SAR control circuit. The comparator is coupled to an output of the CDAC. The SAR control circuit is coupled to an input of the CDAC and to an output of the comparator. The SAR control circuit is configured to provide a feedback signal to the CDAC. The CDAC is configured to apply the feedback signal to form an infinite impulse response filter.

20 Claims, 5 Drawing Sheets

(56) References Cited

U.S. PATENT DOCUMENTS

2020/0077039 A1* 3/2020 Zimmerman ......... H03M 1/466
2020/0127676 A1* 4/2020 Wang ................... H03M 1/468

* cited by examiner

SUCCESSIVE APPROXIMATION REGISTER ANALOG-TO-DIGITAL CONVERTER WITH EMBEDDED FILTERING

BACKGROUND

Wireless local area networks (WLANs), including WLANs based on an IEEE 802.11 standard, provide communication between electronic devices. The radios in electronic devices that communicate via a WLAN may consume a significant amount of power. To reduce power consumption, some electronic devices include a wake-up radio in addition to the main radio. Power consumption of the wake-up radio may be much lower than that of the main radio. The electronic device may turn off the main radio to conserve power, and use the wake-up radio to receive transmitted packets that trigger activation of the main radio. Electronic devices powered by limited power sources, such as batteries, may benefit from use of a wake-up radio to extend operating life.

SUMMARY

A successive approximation register (SAR) analog-to-digital converter (ADC) for use in a wireless local area network (WLAN) wake-up radio is disclosed herein. The SAR ADC provides digital sample feedback to a capacitive digital-to-analog converter (CDAC) to form an infinite impulse response (IIR) filter that attenuates blocking signals. In one example, a SAR ADC includes a CDAC, a comparator, and a SAR control circuit. The CDAC includes a plurality of capacitors. The comparator includes an input coupled to an output of the CDAC. The SAR control circuit includes a digital sample register, a successive approximation register, and a selector circuit. The selector circuit includes a first input, a second input, and an output. The first input of the selector circuit is coupled to an output of the digital sample register. The second input of the selector circuit is coupled to an output of the successive approximation register. The output of the selector circuit is coupled to an input of the CDAC.

A SAR ADC includes a CDAC, a comparator, and a SAR control circuit. The comparator is coupled to an output of the CDAC. The SAR control circuit is coupled to an input of the CDAC and to an output of the comparator. The SAR control circuit is configured to provide a feedback signal to the CDAC. The CDAC is configured to apply the feedback signal in an infinite impulse response filter.

A wake-up receiver includes a mixer circuit and a SAR ADC. The mixer circuit is configured to down convert a received radio frequency signal. The SAR ADC is coupled to the mixer circuit, and is configured to digitize an output signal of the mixer circuit. The SAR ADC includes a CDAC, a comparator, a SAR control circuit, and an infinite impulse response filter. The comparator is coupled to the CDAC. The SAR control circuit is coupled to the CDAC and the comparator. The infinite impulse response filter includes the CDAC and the SAR control circuit.

BRIEF DESCRIPTION OF THE DRAWINGS

For a detailed description of various examples, reference will now be made to the accompanying drawings in which.

DETAILED DESCRIPTION

The term "couple" may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Also, in this description, the recitation "based on" means "based at least in part on." Therefore, if X is based on Y, then X may be a function of Y and any number of other factors.

The IEEE 802.11ba standard specifies a wireless receiver that includes a low-power wake-up radio. The wake-up radio must operate in the presence of blocking signals generated by nearby devices. Applications of the wireless receiver are generally cost sensitive, so the circuit area of the wake-up radio must be small to reduce cost. The wake-up radio includes a successive approximation register (SAR) analog-to-digital converter (ADC) to digitize received radio frequency signals. The dynamic range, power consumption, and cost of the SAR ADC can be reduced if the blocking signals are filtered from the received radio frequency signals (the signals to be digitized). Some wake-up radio implementations include a resistor capacitor filter to attenuate the blocking signals. However, the resistors and capacitors used in some examples to filter the blocking signals consume substantial die area, which increases circuit size and cost.

The wireless radios of the present disclosure attenuate blocking signals without inclusion of dedicated passive or active filters. The wake-up radios disclosed herein include a SAR ADC that implements an embedded infinite impulse response (IIR) filter to attenuate blocking signals. The IIR is implemented within the SAR ADC using digital sample feedback to the capacitive digital-to-analog converter (CDAC) of the SAR ADC. Thus, the wake-up radios attenuate blocking signals without the additional circuit area, cost, and power consumption of a discrete filter.

Figure 1:
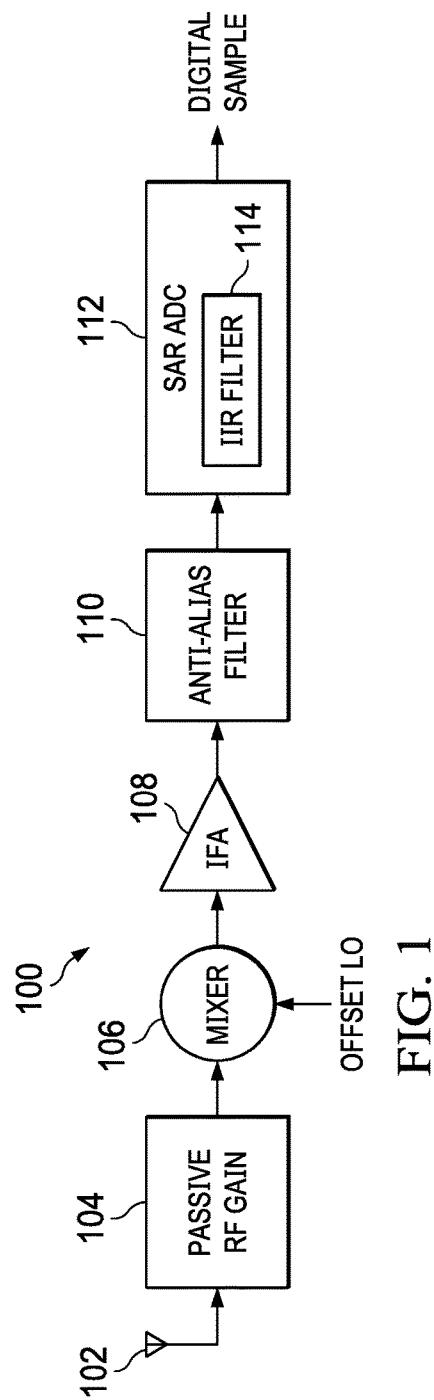
FIG. 1 shows a block diagram for a portion of a wake-up receiver in accordance with this description.

FIG. 1 shows a block diagram for a portion of a wake-up receiver 100 in accordance with this description. The wake-up receiver 100 includes an antenna 102, passive radio frequency (RF) gain circuitry 104, a mixer 106, an intermediate frequency amplifier 108, an anti-alias filter 110, and a SAR ADC 112. The antenna 102 converts RF signals from airwave to conducted form. The antenna 102 is coupled to the passive RF gain circuitry 104, and RF signals detected by the antenna 102 are provided to the passive RF gain circuitry 104. The passive RF gain circuitry 104 applies gain to the detected signals. The RF signal output of the passive RF gain circuitry 104 is provided to the mixer 106.

The mixer 106 down converts the RF signals to an intermediate frequency range. The down conversion includes mixing the received RF signals with a local oscillator signal (e.g., multiplying the RF signals by the local oscillator signal). The intermediate frequency output of the mixer 106 is provided to and amplified by the intermediate frequency amplifier 108.

The output of the intermediate frequency amplifier 108 is low pass filtered by the anti-alias filter 110 to limit the bandwidth of signal provided to the SAR ADC 112 to a range that prevents aliasing in the SAR ADC 112. The SAR ADC 112 digitizes the output of the anti-alias filter 110. In the process of sampling the output of the anti-alias filter 110, the SAR ADC 112 implements an embedded IIR filter 114. The embedded IIR filter 114 attenuates blocking signals generated by other devices operating in the vicinity of the wake-up receiver 100. Implementation of the embedded IIR filter 114 reduces the die area of the wake-up receiver 100, relative to implementations of a wake-up receiver that includes a resistor-capacitor or active filter separate from the SAR ADC 112.

Figure 2:
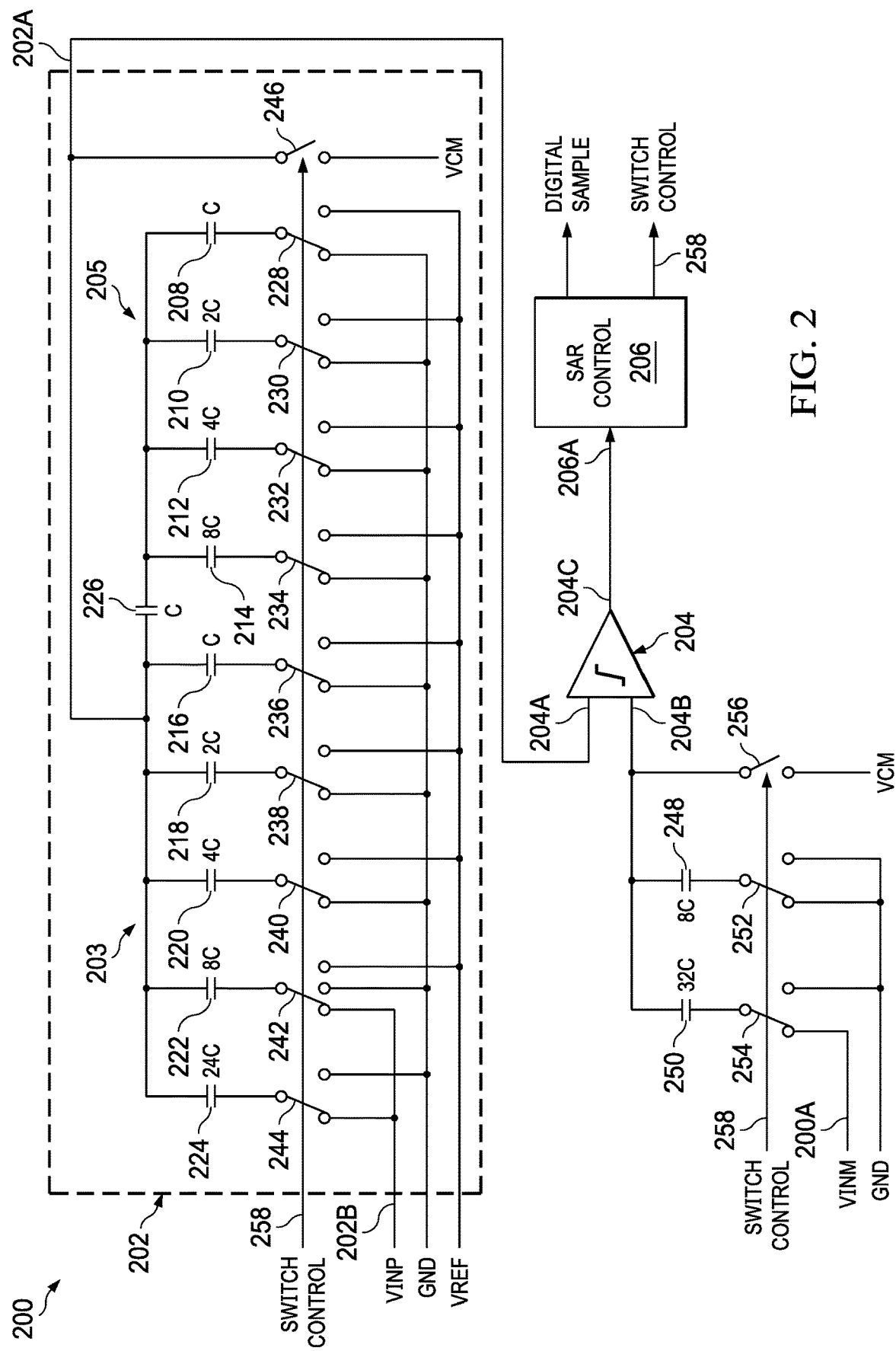
FIG. 2 shows a block diagram for a successive approximation register (SAR) analog-to-digital converter (ADC) that includes an embedded infinite impulse response (IIR) filter in accordance with this description.

FIG. 2 shows a block diagram for a successive approximation register (SAR) analog-to-digital converter (ADC) 200 that includes an embedded IIR filter in accordance with this description. The SAR ADC 200 is an implementation of the SAR ADC 112. The SAR ADC 200 includes a CDAC 202, a comparator 204, and a SAR control circuit 206. The comparator 204 compares output voltage of the CDAC 202 to the voltage on the top plate of the capacitor 250 and capacitor 248 to provide bit decision information to the SAR control circuit 206. The comparator 204 includes an input terminal 204A (e.g., a non-inverting input terminal) coupled to an output terminal 202A of the CDAC 202, an input terminal 204B (e.g., an inverting input terminal) coupled to a top plate of the capacitor 250 and a top plate of the capacitor 248. An output terminal 204C of the comparator 204 is coupled to an input terminal 206A of the SAR control circuit 206.

The CDAC 202 includes a plurality of capacitors 208-224. The capacitors 216, 218, 220, 222, and 224 form an MSB stage 203, and the capacitors 208, 210, 212, and 214 form an LSB stage 205. The MSB stage 203 is coupled to the LSB stage 205 via a bridge capacitor 226. The capacitors 208-222 form a binary weighted capacitor array that presents binary weighted capacitance at the output terminal 202A. The capacitance presented at the output terminal 202A by the capacitors 208-214 is scaled by the bridge capacitor 226 to provide the binary weighting relative to the capacitors 216-222. The voltages applied to the binary weighted capacitors 208-222 are switched in the binary search process controlled by the SAR control circuit 206 to determine digital sample bit values. The capacitor 224 is a sampling capacitor having a capacitance that is greater than (a multiple of) the capacitance of the largest capacitor of the binary weighted capacitor array. For example, the capacitor 224 may have a capacitance that is about three times that of the largest binary weighted capacitance.

The bottom plates of the capacitors 208-224 are coupled to switches 228-244. The SAR control circuit 206 controls the switches 228-244, via the switch control signals 258, to sample input voltage to be digitized and execute the binary search for the digital sample value corresponding to a sampled analog signal. The switches 228, 230, 232, and 234 are respectively coupled to the capacitors 208, 210, 212, and 214 to switchably couple the bottom plates of the capacitors 208-214 to a reference voltage (VREF) or ground (GND) as selected by the SAR control circuit 206. Similarly, the switches 236, 238, 240, and 242 are respectively coupled to the capacitors 216, 218, 220, and 222 to switchably couple the bottom plates of the capacitors 208-214 to a reference voltage (VREF) or ground (GND) as selected by the SAR control circuit 206.

The switch 244 is coupled to the capacitor 224 to switchably couple the bottom plate of the capacitor 224 to an analog signal input 202B or ground as selected by the SAR control circuit 206. The switch 242 also couples the capacitor 222 to the analog signal input 202B, under control of the SAR control circuit 206, for sampling an analog input signal. Thus, the switches 242 and 244 (first subset of the switches of the CDAC 202) connect the capacitors 222 and 224 (first subset of the capacitors of the CDAC 202) to the analog signal input 202B.

The bottom plate of the capacitor 250 is coupled to the switch 254, which is controlled by the SAR control circuit 206 to connect the bottom plate of the capacitor 250 to an analog signal input terminal 200A (VINM input terminal) or ground. The switch 254 connects the bottom plate of the capacitor 250 to the analog signal input terminal 200A for sampling, and connects the bottom plate of the capacitor 250 to ground for digitization of the acquired sample. The switch 252 connects the bottom plate of the capacitor 248 to ground for sampling and digitization.

The top plates of the capacitors 216-224 are coupled to the switch 246, which is controlled by the SAR control circuit 206 to connect the top plates to a common mode reference voltage (e.g., ground). Similarly, the top plates of the capacitors 248 and 250 are coupled to the switch 256 which is controlled by the SAR control circuit 206 to connect the top plates to the common mode reference voltage (VCM).

The SAR control circuit 206 controls the switches 228-246 and 252-256 to sample and digitize an analog input signal. In a sample acquisition phase, the SAR control circuit 206 controls the switches 246 and 256 to connect the capacitor top plates to the common mode reference voltage, and controls the switch 244 and the switch 242 to capture a sample of the analog input signal (VINP) on the capacitor 222 and the capacitor 224. In the sample acquisition phase, the SAR control circuit 206 also controls the switches 228-240 to connect the bottom plates of the capacitors 208-220 to VREF and GND in a pattern of a digital sample last generated by the SAR ADC 200. Thus, the SAR control circuit 206 provides a feedback signal (a last generated digital sample) to the CDAC 202. The capacitors 208-220 of the CDAC 202 are charged based on the feedback signal for summation with the sample voltage captured on the capacitor 222 and the capacitor 224. Such operation of the SAR ADC 200 may be expressed as:

$$y[n]=x[n]+a*y[n-1]$$

where:
y[n] is the new digital sample value;
x[n] is the currently sampled analog signal value;
y[n−1] is the last digital sample value; and
a is a scaling coefficient applied to y[n−1].
a may have a value of 0.5 or 0.25 in various implementations of the SAR ADC 200, where a is applied to y[n−1] by right-shifting y[n−1] by one or two bits and discarding the least significant bits. For example, in the SAR ADC 200, if a=0.5, the SAR control circuit 206 sets the switch 240 to present the MSB of y[n−1] on the bottom plate of the 220 (i.e., y[n−1] is right-shifted by one bit).

Feeding back the last generated sample to the CDAC 202 forms an embedded IIR filter, which may be expressed as:

$$\frac{Y(z)}{X(z)} = \frac{1}{1 - a * z^{-1}}$$

Thus, in the SAR ADC 200, the CDAC 202 and the SAR control circuit 206 are applied to provide an implementation of the embedded IIR filter 114.

Implementations of the IIR filter 114 are also applicable to differential implementations of the SAR ADC 112. For example, in a differential implementation of the SAR ADC 200, an instance of the CDAC 202 is coupled to the input terminal 204B of the comparator 204. In the differential implementation of the SAR ADC 200, the inverse of the last generated sample is fed back to the instance of the CDAC 202 coupled to the input terminal 204B of the comparator 204, and the non-inverted last generated sample is fed back to the CDAC 202 coupled to the input terminal 204A of the comparator 204.

Figure 3:
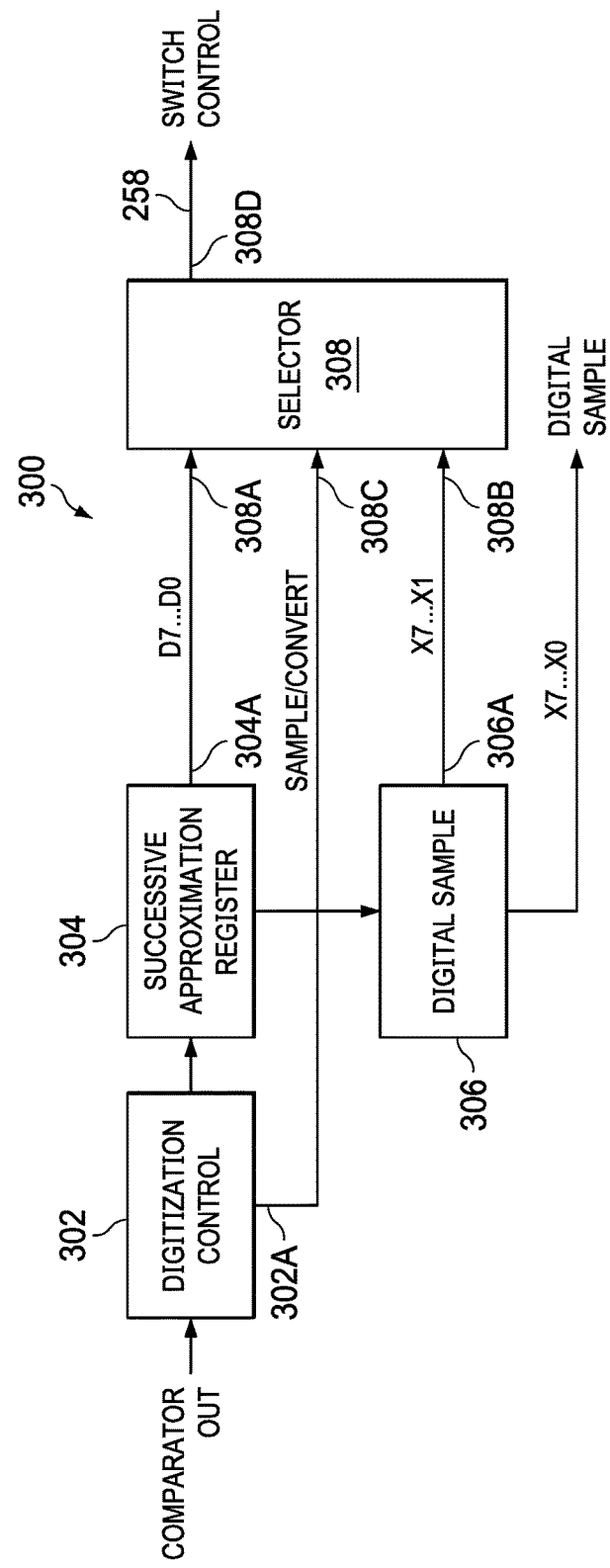
FIG. 3 shows a block diagram for a SAR control circuit configured to implement an embedded IIR in a SAR ADC in accordance with this description.

FIG. 3 shows a block diagram for a SAR control circuit 300 configured to implement an embedded IIR in a SAR ADC in accordance with this description. The SAR control circuit 300 is an implementation of the SAR control circuit 206. The SAR control circuit 300 includes a digitization control circuit 302, a successive approximation register 304, a digital sample register 306, and a selector circuit 308. The digitization control circuit 302 controls sampling and digitization of an analog input signal. In the digitization phase, the digitization control circuit 302 successively sets/resets the bits of the successive approximation register 304 based on the output of the comparator 204 as each bit is tested. The digitization control circuit 302 may be implemented as a finite state machine configured to perform a binary search in the digitization phase, and implement the embedded IIR in the sampling phase.

At completion of the digitization phase, the successive approximation register 304 contains a digital sample value corresponding to the analog input signal. The digital sample value is stored in the digital sample register 306.

The selector circuit 308 selects the output of the successive approximation register 304 or the output of the digital sample register 306 to control the switches 228-240 (second subset of the switches) of the CDAC 202 based on a sample/convert signal generated by the digitization control circuit 302. In the sample acquisition phase, the selector circuit 308 selects and routes the digital sample value output by the digital sample register 306 to control the switches 228-240. In the sample digitization phase, the selector circuit 308 selects and routes the output of the successive approximation register 304 to control the switches 228-242. For example, in the SAR control circuit 300, the eight-bit digital sample output of the digital sample register 306 is designated X7 . . . X0. X7 . . . X0 is right shifted by one bit and X7 . . . X1 are applied to control the switches 228-240 of the CDAC 202 in the sample acquisition phase. The switch control may cause the switch 240 to connect the bottom plate of the 220 to VREF if X7 is a logic "1," and connect the bottom plate of the 220 to GND if X7 is a logic "0," and so on for each of the switches 228-240 thereby providing the value of X7 . . . X1 on the bottom plates of the capacitors 208-220 in the sample acquisition phase.

The selector circuit 308 includes an input 308A coupled to an output 304A of the successive approximation register 304, an input 308B coupled to an output 306A of the digital sample register 306, and a select input 308C coupled to an output 302A of the digitization control circuit 302. An output 308D of the selector circuit 308 is coupled to the switches 228-246 and 252-256 of the CDAC 202. Switch control signals 258 are provided at output 308D of the selector circuit 308.

Figure 4:
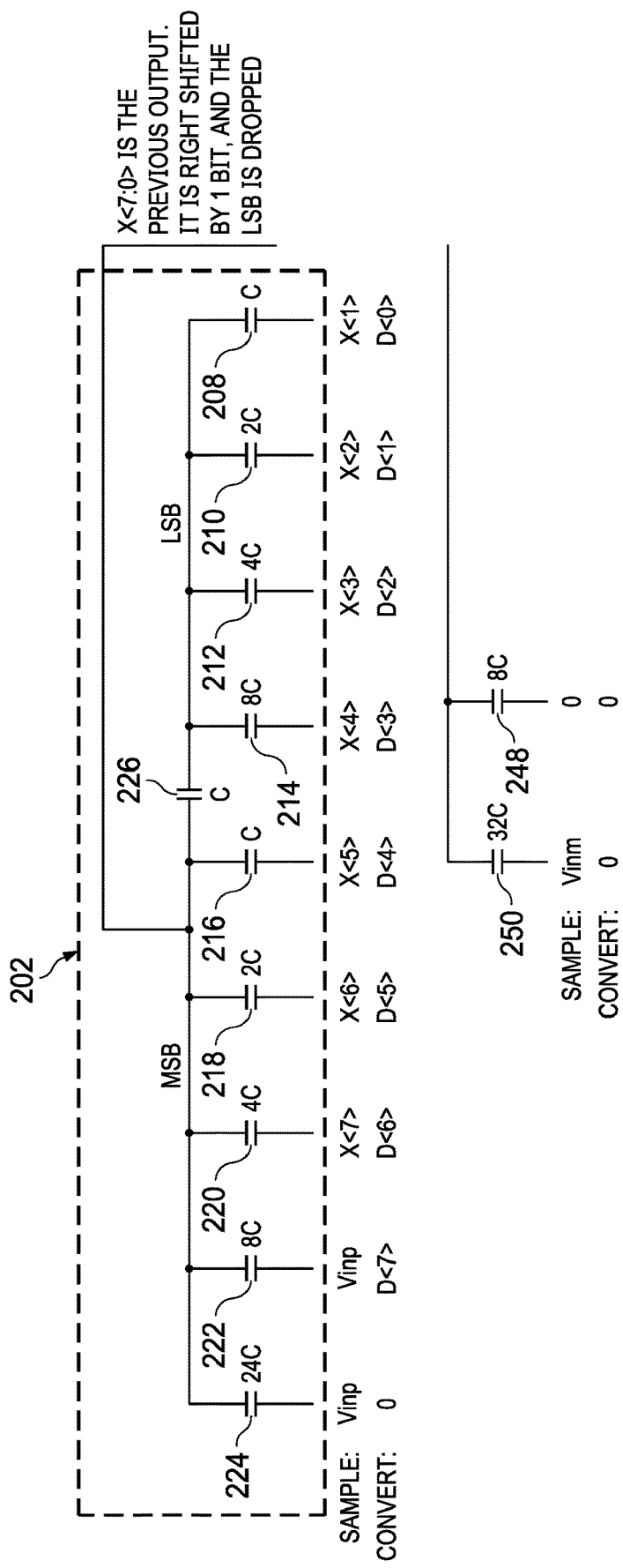
FIG. 4 shows inputs to the capacitive digital-to-analog converter (CDAC) of a SAR ADC that in includes an embedded IIR filter in accordance with this description.

FIG. 4 more succinctly illustrates SAR control circuit 206 control of the CDAC 202 in sample acquisition and digitization phases. In the sample acquisition phase, the SAR control circuit 206 sets the switches 244 and 242 to sample the analog input signal (VINP), and sets the switches 228-240 to produce the values of the bits X7 . . . X1 of the last generated digital sample value on the bottom plates of the capacitors 208-220, thereby producing a sum of the sampled analog input signal and one-half the last generated digital sample value at the output terminal 202A of the CDAC 202. In the digitization phase, the SAR control circuit 206 sets the switch 244 to ground the bottom plate of the capacitor 224, and sets the switches 228-242 based on the values of the bits D7 . . . D0 of the successive approximation register 304 select the bits of the new digital sample value.

Figure 5:
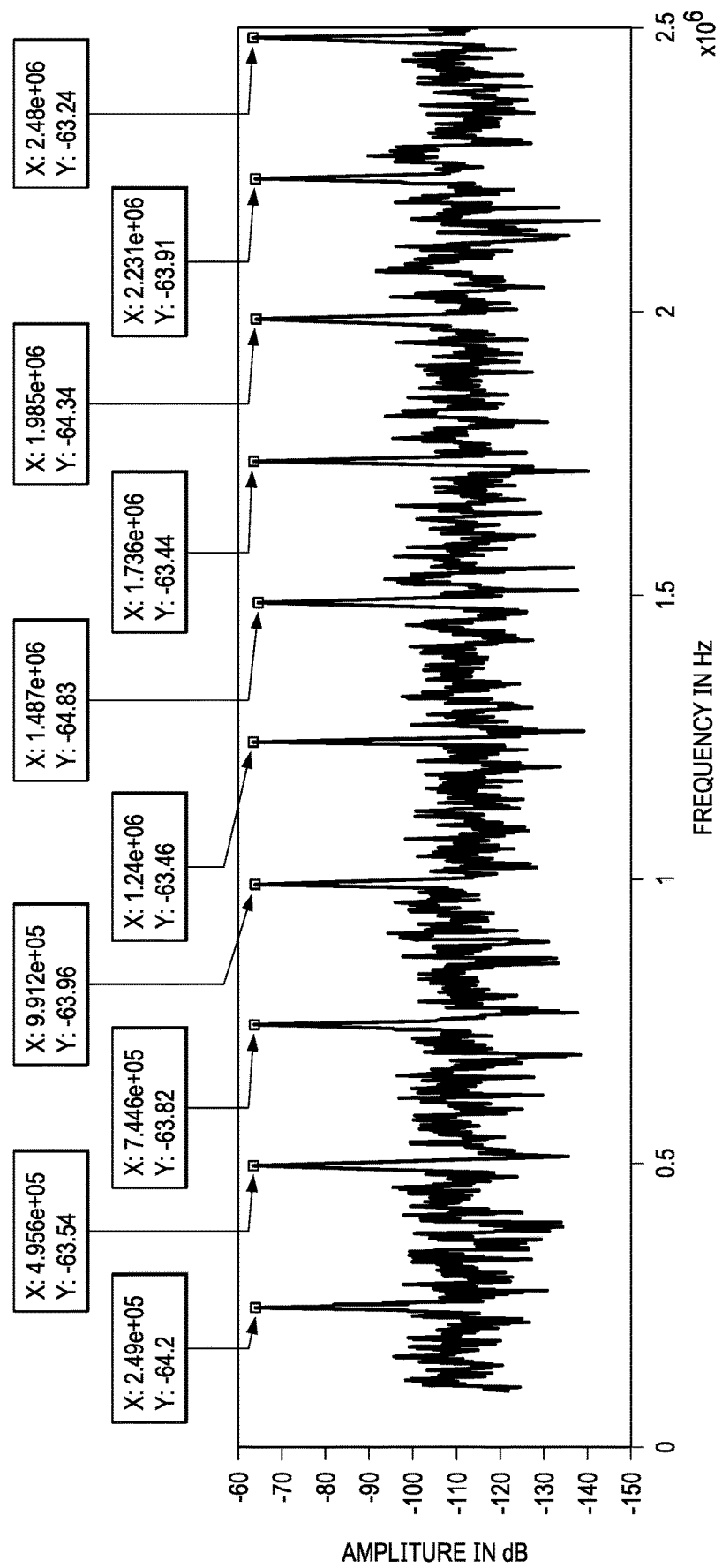
FIG. 5 shows signal power in a wake-up receiver that lacks filtering of blocking signals.
Figure 6:
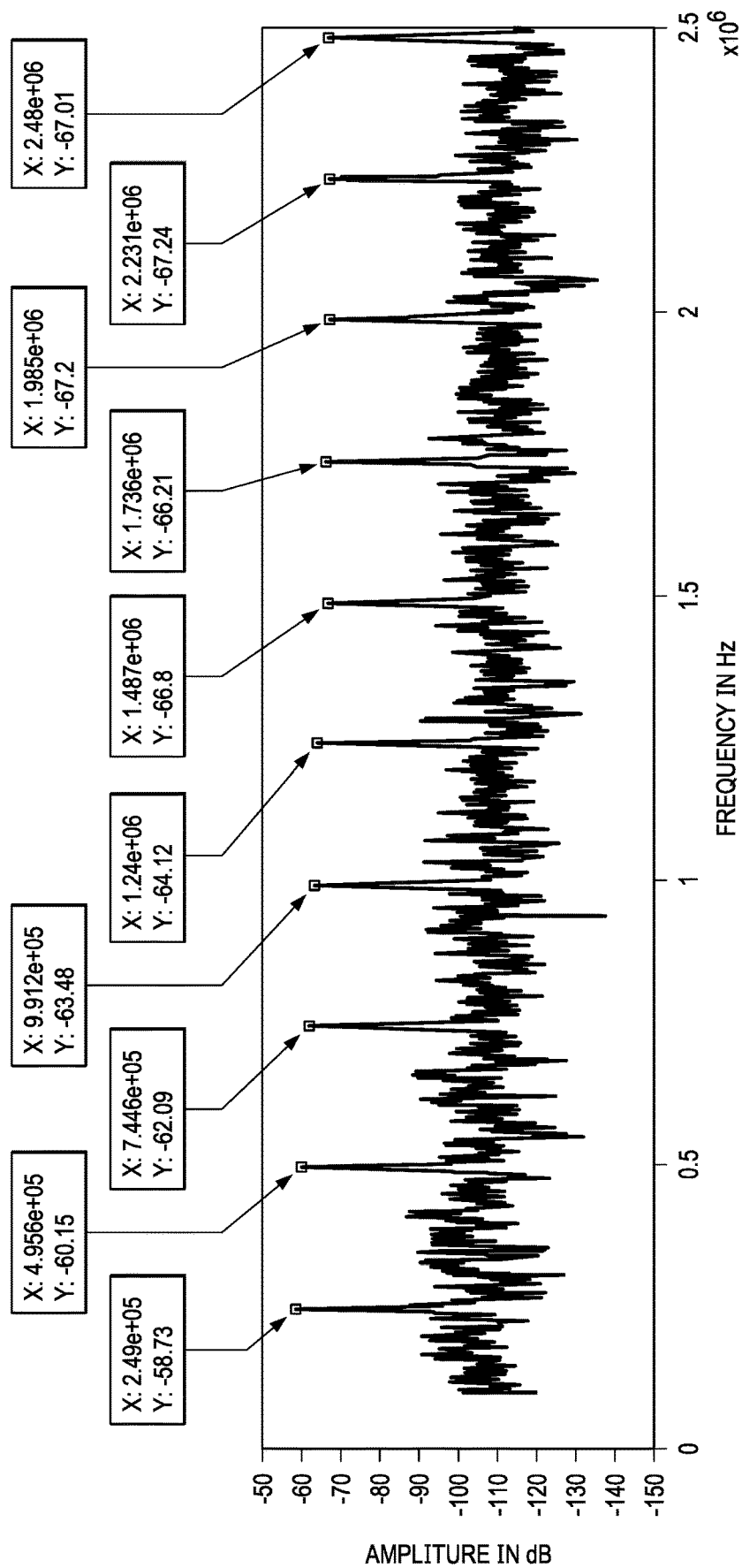
FIG. 6 shows signal power in a wake-up receiver that include a SAR ADC that implements an embedded IIR filter in accordance with this description.

FIGS. 5 and 6 show signal power in a wake-up receiver that lacks filtering of blocking signals and in a wake-up receiver that includes a SAR ADC that implements an embedded IIR filter in accordance with this description. FIG. 5 shows that without filtering signal power is generally constant up to 2.5 megahertz (MHz). FIG. 6 shows that in a wake-up receiver incorporating the SAR ADC 200, signal power is attenuated by about 8.3 decibels at 2.5 MHz The attenuation provided by the embedded IIR allows for the size and cost of the wake-up radio to be reduced relative to wake-up radio implementations that lack that lack the embedded IIR.

Modifications are possible in the described embodiments, and other embodiments are possible, within the scope of the claims.

What is claimed is:

1. A successive approximation register (SAR) analog-to-digital converter (ADC), comprising:
    a capacitive digital-to-analog converter (CDAC) comprising a plurality of capacitors;
    a comparator comprising an input coupled to an output of the CDAC; and
    a SAR control circuit comprising:
        a digital sample register;
        a successive approximation register;
        a selector circuit comprising:
            a first input coupled to an output of the digital sample register;
            a second input coupled to an output of the successive approximation register; and
            an output coupled to an input of the CDAC;
        wherein:
            the SAR control circuit is configured to, in a first sample acquisition cycle:
                store, on a first subset of the plurality of capacitors of the CDAC, an analog input signal to be digitized; and
                store, on a second subset of the plurality of capacitors of the CDAC, bits of a digital sample value representing a previous sample of the analog input signal.

2. The SAR ADC of claim 1, wherein the selector circuit is configured to:
    route the output of the digital sample register to the CDAC during sample acquisition; and route the output of the successive approximation register to the CDAC during sample digitization.

3. The SAR ADC of claim 1, wherein the SAR control circuit comprises a digitization control circuit comprising an output coupled to a select input of the selector circuit.

4. The SAR ADC of claim 1, further comprising:
an analog signal input;
wherein the CDAC comprises a plurality of switches coupled to the plurality of capacitors and the SAR control circuit; wherein in a sample acquisition phase a first subset of the switches is configured to connect the first subset of the plurality of capacitors to the analog signal input.

5. The SAR ADC of claim 4, wherein a second subset of the switches is coupled to the selector circuit.

6. The SAR ADC of claim 5, wherein the SAR control circuit is configured to right shift a digital sample value stored in the digital sample register to control the second subset of the switches.

7. The SAR ADC of claim 1, wherein the plurality of capacitors comprises a binary weighted capacitor array and a sampling capacitor having a capacitance that is a multiple of a capacitance of a largest capacitor of the binary weighted capacitor array.

8. A successive approximation register (SAR) analog-to-digital converter (ADC), comprising:
a capacitive digital-to-analog converter (CDAC);
a comparator coupled to an output of the CDAC; and
a SAR control circuit coupled to an input of the CDAC and an output of the comparator, and configured to, in a sample acquisition phase of the SAR ADC, provide a feedback signal to the CDAC;
wherein:
the feedback signal comprises a digital sample value generated by the SAR ADC in last completed digitization phase; and
the CDAC is configured to apply the feedback signal to form an infinite impulse response filter.

9. The SAR ADC of claim 8, wherein the feedback signal comprises a digital sample value stored in the SAR control circuit.

10. The SAR ADC of claim 9, wherein the SAR control circuit is configured to right shift the digital sample value to generate the feedback signal.

11. The SAR ADC of claim 8, wherein the CDAC comprises a plurality of capacitors and the SAR control circuit is configured to charge the capacitors based on the feedback signal.

12. The SAR ADC of claim 11, wherein the plurality of capacitors comprises a binary weighted capacitor array and a sampling capacitor having a capacitance that is a multiple of a capacitance of a largest capacitor of the binary weighted capacitor array.

13. The SAR ADC of claim 11, further comprising:
an analog signal input;
wherein the CDAC comprises a plurality of switches coupled to the plurality of capacitors and the SAR control circuit; wherein the SAR control circuit is configured to, in a sample acquisition phase, set a first subset of the switches to connect a first subset of the capacitors to the analog signal input.

14. The SAR ADC of claim 13, wherein the SAR control circuit is configured to, in the sample acquisition phase, set a second subset of the switches to charge a second subset of the capacitors based on the feedback signal.

15. A wake-up receiver comprising:
a mixer circuit configured to down convert a received radio frequency signal; and
a successive approximation register (SAR) analog-to-digital converter (ADC) coupled to the mixer circuit and configured to digitize an output signal of the mixer circuit, and comprising:
a capacitive digital-to-analog converter (CDAC);
a comparator coupled to the CDAC; and
a SAR control circuit coupled to the CDAC and the comparator, and configured to, in a sample acquisition phase of the SAR ADC, sum provide, to in the CDAC, the output signal of the mixer circuit and a feedback signal based on a digital sample value generated by the SAR ADC in a last completed digitization phase.

16. The wake-up receiver of claim 15, wherein:
the SAR control circuit comprises a digital sample register configured to store the digital sample value.

17. The wake-up receiver of claim 16, wherein the CDAC comprises a plurality of capacitors and the SAR control circuit is configured to charge the capacitors based on the feedback signal.

18. The wake-up receiver of claim 17, wherein the plurality of capacitors comprises a binary weighted capacitor array and a sampling capacitor having a capacitance that is a multiple of a capacitance of a largest capacitor of the binary weighted capacitor array.

19. The wake-up receiver of claim 17, wherein:
the SAR ADC comprises an analog signal input configured to receive the output signal of the mixer circuit;
the CDAC comprises a plurality of switches coupled to the plurality of capacitors and the SAR control circuit; and
the SAR control circuit is configured to, in a sample acquisition phase, set a first subset of the switches to connect a first subset of the capacitors to the analog signal input.

20. The wake-up receiver of claim 19, wherein the SAR control circuit is configured to, in the sample acquisition phase, set a second subset of the switches to charge a second subset of the capacitors based on the feedback signal.

* * * * *